United States Patent
Sills et al.

(10) Patent No.: US 10,741,382 B2
(45) Date of Patent: Aug. 11, 2020

(54) METHODS OF FORMING NANOSTRUCTURES USING SELF-ASSEMBLED NUCLEIC ACIDS, AND NANOSTRUCTURES THEREOF

(71) Applicant: Micron Technology, Inc., Boise, ID (US)

(72) Inventors: Scott E. Sills, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/798,672

(22) Filed: Oct. 31, 2017

(65) Prior Publication Data

US 2018/0061635 A1 Mar. 1, 2018

Related U.S. Application Data

(63) Continuation of application No. 14/677,445, filed on Apr. 2, 2015, now Pat. No. 9,881,786.

(51) Int. Cl.
*H01L 21/02* (2006.01)
*H01L 21/033* (2006.01)
(Continued)

(52) U.S. Cl.
CPC .... *H01L 21/02118* (2013.01); *B81C 1/00031* (2013.01); *B81C 1/00206* (2013.01); *B82Y 40/00* (2013.01); *H01L 21/02227* (2013.01); *H01L 21/0332* (2013.01); *H01L 21/0337* (2013.01); *H01L 21/0338* (2013.01); *H01L 21/31138* (2013.01); *H01L 29/02* (2013.01); *H01L 29/0665* (2013.01); *H01L 29/66007* (2013.01)

(58) Field of Classification Search
CPC ......... H01L 21/02118; H01L 21/02227; H01L 21/0332; H01L 21/0337; H01L 21/0338; H01L 21/031138; H01L 29/02; H01L 29/0665; H01L 29/66007; B81C 1/00031; B81C 1/00206; B82Y 40/00
USPC ...................................................... 257/618
See application file for complete search history.

(56) References Cited

U.S. PATENT DOCUMENTS

| | | | |
|---|---|---|---|
| 8,501,923 B2 | 8/2013 | Rothemund | |
| 2002/0171079 A1 | 11/2002 | Braun et al. | |

(Continued)

FOREIGN PATENT DOCUMENTS

| | | | |
|---|---|---|---|
| CN | 1287689 A | 3/2001 | |
| CN | 1379113 A | 11/2002 | |

(Continued)

OTHER PUBLICATIONS

Ashwin Gopinath et al (ACSNaNo, vol. 8, No. 12, pp. 12030-12040, 2014) (Year: 2014).*

(Continued)

*Primary Examiner* — Dzung Tran
(74) *Attorney, Agent, or Firm* — TraskBritt

(57) ABSTRACT

A method of forming a nanostructure comprises forming a directed self-assembly of nucleic acid structures on a patterned substrate. The patterned substrate comprises multiple regions. Each of the regions on the patterned substrate is specifically tailored for adsorption of specific nucleic acid structure in the directed self-assembly.

24 Claims, 6 Drawing Sheets

(51) Int. Cl.

| | |
|---|---|
| H01L 29/06 | (2006.01) |
| B82Y 40/00 | (2011.01) |
| H01L 29/66 | (2006.01) |
| B81C 1/00 | (2006.01) |
| H01L 21/311 | (2006.01) |
| H01L 29/02 | (2006.01) |

(56) References Cited

U.S. PATENT DOCUMENTS

| | | | | |
|---|---|---|---|---|
| 2005/0136453 | A1* | 6/2005 | Sherman | B82Y 30/00 |
| | | | | 435/6.19 |
| 2005/0201149 | A1* | 9/2005 | Duan | B82Y 10/00 |
| | | | | 365/185.03 |
| 2006/0078910 | A1* | 4/2006 | Seeman | B82Y 5/00 |
| | | | | 435/6.11 |
| 2007/0117109 | A1 | 5/2007 | Rothemund | |
| 2009/0018028 | A1* | 1/2009 | Lindsay | B82Y 5/00 |
| | | | | 506/9 |
| 2009/0065764 | A1* | 3/2009 | Heald | B82Y 10/00 |
| | | | | 257/14 |
| 2009/0242405 | A1 | 10/2009 | Mayer et al. | |
| 2009/0264317 | A1 | 10/2009 | Ofir et al. | |
| 2010/0093160 | A1 | 4/2010 | Roh et al. | |
| 2012/0251583 | A1* | 10/2012 | Rothemund | C12P 19/34 |
| | | | | 424/400 |
| 2015/0064233 | A1* | 3/2015 | Shih | A61K 9/127 |
| | | | | 424/450 |
| 2016/0293406 | A1* | 10/2016 | Sills | H01L 21/31138 |

FOREIGN PATENT DOCUMENTS

| | | |
|---|---|---|
| CN | 104391119 A | 3/2015 |
| EP | 0943158 B1 | 1/2005 |
| WO | 2006035859 A1 | 4/2006 |

OTHER PUBLICATIONS

International Search Report for International Patent Application No. PCT/US2016/022013, dated Jun. 30, 2016, 6 pages.

International Written Opinion for International Patent Application No. PCT/US2016/022013, dated Jun. 30, 2016, 9 pages.

Kershner et al., Placement and Orientation of Individual DNA Shapes on Lithographically Patterned Surfaces, Nature Nanotechnology, vol. 4, (2009), 557-561.

Surwade et al., Nanoscale Growth and Patterning of Inorganic Oxides Using DNA Nanostructure Templates, J. Am. Chem. Soc., vol. 135, (2013), 6778-6781.

Taiwanese Office Action and Search Report for Taiwanese Application No. 105110115, dated Jan. 12, 2017, 11 pages.

Wei et al., Complex Shapes Self-Assembled From Single Stranded DNA Tiles, Nature, vol. 485, (2012), 623-627.

Gopinath et al., "Optimized Assembly and Covalent Coupling of Single-Molecule DNA Origami Nanoarrays", American Chemical Society, vol. 8, No. 12 (2014) pp. 12030-12040.

Notice of Rejection Grounds for Japanese Application No. 2017-549368, dated Mar. 13, 2018, 8 pages with English translation.

Chinese Decision of Rejection from Chinese Application No. 201680019953.X, dated Mar. 13, 2019, 12 pages.

Japanese Notice of Reexamination for Japanese Application No. 2017549368, dated May 22, 2019, 7 pages.

Korean Notice of Reasons for Rejection from Korean Application No. 10-2019-7017631, dated Jul. 18, 2019, 12 pages.

Notice of Reasons for Rejection from Korean Application No. 10-2017-7031447, dated Jan. 24, 2018, 5 pages.

Notice of Reasons for Rejection from Korean Application No. 10-2017-7031447, dated May 17, 2018, 5 pages.

Notice of Reasons for Rejection from Korean Application No. 10-2017-7031447, dated Sep. 28, 2018, 16 pages.

Chinese Office Action and Search Report for Chinese Application No. 201680019953.X, dated Sep. 10, 2018, 16 pages.

European Search Report and Search Opinion Received for EP Application No. 16773716.2, dated Nov. 7, 2018, 8 pages.

Korean Decision of Rejection from Korean Application No. 10-2017-7031447, dated Jan. 30, 2019, 8 pages.

Japanese Decision of Rejection from Japanese Application No. 2017-549368, dated Nov. 6, 2018, 10 pages.

Chinese Office Action for Application No. 201680019953, dated Apr. 15, 2020, 16 pages.

\* cited by examiner

METHODS OF FORMING NANOSTRUCTURES USING SELF-ASSEMBLED NUCLEIC ACIDS, AND NANOSTRUCTURES THEREOF

CROSS-REFERENCE TO RELATED APPLICATION

This application is a continuation of U.S. patent application Ser. No. 14/677,445, filed Apr. 2, 2015, now U.S. Pat. No. 9,881,786, issued Jan. 30, 2018, the disclosure of which is hereby incorporated herein in its entirety by this reference.

FIELD

The present disclosure, in various embodiments, relates generally to methods of forming nanostructures using self-assembly of nucleic acids.

BACKGROUND

A continuing goal of integrated circuit fabrication is to decrease the dimensions thereof. Integrated circuit dimensions can be decreased by reducing the dimensions and spacing of the constituent features or structures. For example, by decreasing the dimensions and spacing of semiconductor features (e.g., storage capacitors, access transistors, access lines) of a memory device, the overall dimensions of the memory device may be decreased while maintaining or increasing the storage capacity of the memory device.

As the dimensions and spacing of semiconductor device features become smaller, conventional lithographic processes for forming the semiconductor device features become increasingly more difficult and expensive to conduct. Therefore, significant challenges are encountered in the fabrication of nanostructures, particularly structures having a feature dimension (e.g., critical dimension) less than a resolution limit of conventional photolithography techniques (currently about 40 nm). It is possible to fabricate semiconductor structures with such feature dimensions using a costly pitch division or double patterning technologies. However, use of such processes is limited because the exposure tools are extremely expensive or extremely slow and, further, may not be amenable to formation of structures having dimensions of less than 20 nm.

The development of new processes, as well as materials useful in such processes, is of increasing importance to make the fabrication of small-scale devices easier, less expensive, and more versatile. One example of a method of fabricating small-scale devices that addresses some of the drawbacks of conventional lithographic techniques is directed self-assembly (DSA) of phase separated block copolymers.

Although DSA block copolymer is useful for fabrication of semiconductor structures having dimensions of less than 40 nm, the self-assembled block copolymer materials are generally restricted to periodic patterns and may not produce nanostructures exhibiting sufficiently low defect levels.

Self-assembled nucleic acids have been investigated for forming semiconductor devices. The specificity of complementary base pairing in nucleic acids provides self-assembled nucleic acids that may be used for self-assembled nucleic acid lithography processes.

U.S. Pat. No. 8,501,923 discloses a self-assembled DNA origami structure. The DNA origami structure is formed from structural units, wherein each structural unit comprises a single stranded polynucleotide scaffold and a plurality of helper/staple strands. The helper/staple strands are designed to be at least partially complementary to the single stranded polynucleotide scaffold such that the helper/staple strands self-anneal with the single stranded polynucleotide scaffold into a structural unit. The DNA origami structure may have dimensions of 100-200 nm with a resolution of 6 nm.

Arbitrary two-dimensional (2D) patterns of self-assembled nucleic acids have been reported in Wei et al., *Complex shapes self-assembled from single stranded DNA tiles*, Nature, 485 (2012), 623-627. The arbitrary 2D patterns are created using self-assembled DNA molecular canvases that are formed from DNA subunits. The DNA subunit has dimensions of less than 10 nm. The DNA subunit may be a single strand DNA having dimensions of 3 nm. The self-assembled DNA molecular canvas may have dimensions of 200 nm.

Surwade et al. disclose a method of forming custom-shaped inorganic oxide nanostructures by using self-assembled DNA-nanostructure templates. Surwade et al., *Nanoscale Growth and Patterning of Inorganic Oxides Using DNA Nanostructure Templates,* J. Am. Chem. Soc., 135 (2013), 6778-6781. The self-assembled DNA nanostructure is deposited on a substrate without registration, and then used as a template for a selective deposition of inorganic oxide material to provide an inorganic oxide nanostructure. The inorganic oxide nanostructure may be used as a hard mask for etching the substrate.

Kershner et al. disclose the placement and orientation of individual self-assembled DNA structures on a lithographically patterned substrate. Kershner et al., *Placement and orientation of individual DNA shapes on lithographically patterned surfaces*, Nature Nanotechnology, 4 (2009), 557-561. DNA origami, in which a long single strand of DNA is folded into a shape using shorter "staple strands," is used as the self-assembled DNA structure. Electron beam lithography and dry oxidative etching are used to create DNA origami-shaped binding sites on the materials such as silicon dioxide ($SiO_2$) and diamond-like carbon (DLC).

DETAILED DESCRIPTION

Figure 1:
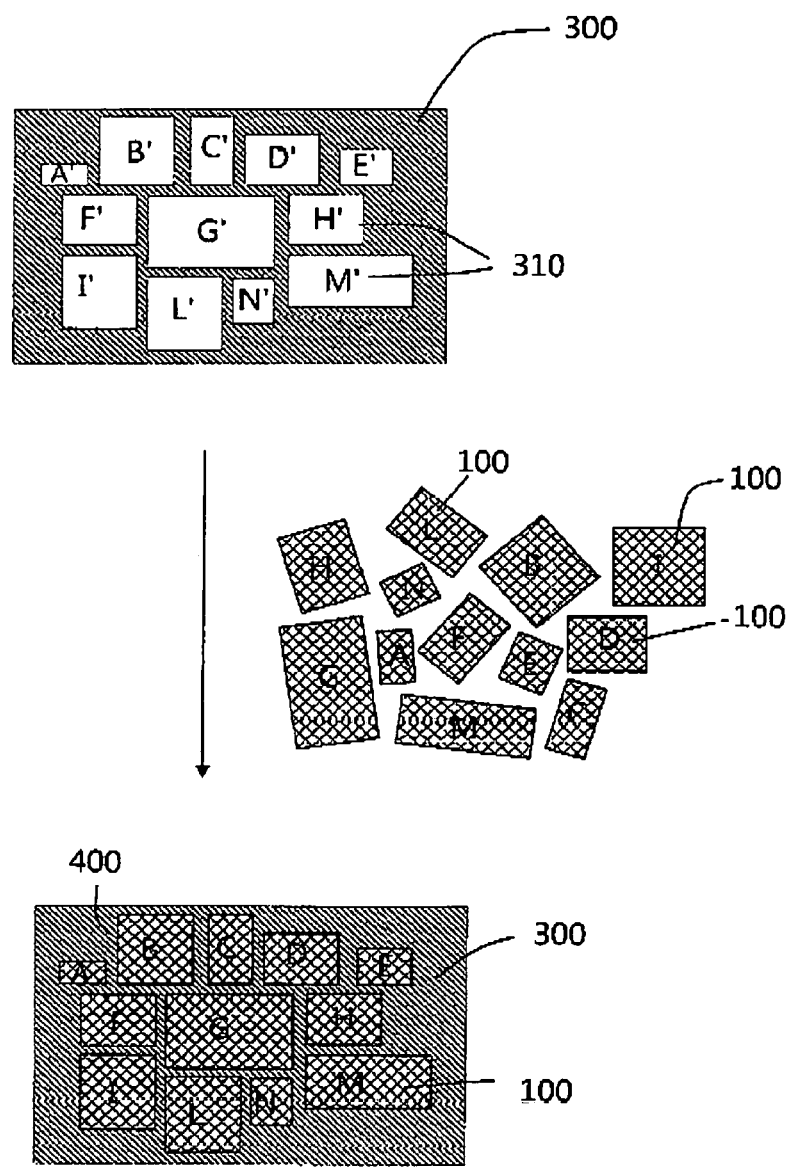
FIG. 1 shows top views of stages of forming a directed self-assembly of multiple DNA structures on a patterned substrate according to one embodiment of the present disclosure.

The following description provides specific details, such as material types, material thicknesses, and processing conditions in order to provide a thorough description of embodiments of the disclosure. However, a person of ordinary skill in the art will understand that embodiments of the present disclosure may be practiced without employing these specific details. Indeed, the embodiments of the present disclosure may be practiced in conjunction with conventional fabrication techniques employed in the industry.

In addition, the description provided herein does not form a complete process flow for forming nanostructures. Only those process acts and structures necessary to understand the embodiments of the present disclosure are described in detail below. Additional acts to form the complete nanostructures may be performed by conventional fabrication techniques. Also the drawings accompanying the application are for illustrative purposes only, and are thus not necessarily drawn to scale. Elements common between figures may retain the same numerical designation. Furthermore, while the materials described and illustrated herein may be formed as layers, the materials are not limited thereto and may be formed in other three-dimensional configurations.

As used herein, the singular forms "a," "an," and "the" are intended to include the plural forms as well, unless the context clearly indicates otherwise.

As used herein, the term "substrate" means and includes a base material or construction upon which additional materials are formed. The substrate may be, for example, a semiconductor substrate, a base semiconductor material on a supporting structure, a metal electrode or a semiconductor substrate having one or more materials, structures or regions formed thereon. The substrate may be a conventional silicon substrate, or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process acts may have been conducted to form materials, regions, or junctions in the base semiconductor structure or foundation. In one embodiment, the substrate is a silicon-containing material, such as a silicon substrate. The substrate may be doped or undoped.

As used herein, the term "nucleic acid" means and includes a polymeric form of nucleotides (e.g., polynucleotides and oligonucleotides) of any length that comprises purine and pyrimidine bases, or chemically or biochemically modified purine and pyrimidine bases. Nucleic acids may comprise single stranded sequences, double stranded sequences, or portions of both double stranded or single stranded sequences. As non-limiting examples, the nucleic acid may include ribonucleic acid (RNA), deoxyribonucleic acid (DNA), peptide nucleic acid (PNA), or combinations thereof. The backbone of the polynucleotide may comprise sugars and phosphate groups as may typically be found in RNA or DNA, or modified sugar and/or phosphate groups. Furthermore, the polynucleotide may comprise modified nucleotides, such as methylated nucleotides and nucleotide analogs.

Disclosed embodiments relate generally to nanostructures comprising directed self-assemblies of nucleic acid structures on a patterned substrate, and to methods of forming the nanostructures. In some embodiments, the nucleic acid structure may be DNA structure. Non-limiting examples of such DNA structure may include those described in Wei et al., supra, or the DNA origami structure disclosed in U.S. Pat. No. 8,501,923. The patterned substrate comprises multiple regions. Upon bringing the nucleic acid structures into contact with the patterned substrate, the nucleic acid structures adsorb onto specific regions of the patterned substrate as directed by interactions between the nucleic acid structures and the patterned substrate to provide directed self-assembly of nucleic acid structures on the patterned substrate.

Accordingly, a nanostructure comprises directed self-assembly of nucleic acid structures on a patterned substrate. The patterned substrate comprises regions, wherein each of the regions is configured to selectively adsorb one of the nucleic acid structures in the directed self-assembly.

As used herein, the term "directed self-assembly of multiple DNA structures" or "DSA of multiple DNA structures" refers to a self-assembly of multiple DNA structures on the patterned substrate that is directed by interactions between the DNA structures and the patterned substrate to enable the selective adsorption of specific DNA structures to specific regions of the patterned substrate.

As shown in FIG. 1, DNA structure 100 may have different configurations, e.g., DNA structures A, B, C, D, E, F, G, H, I, L, M, and N. In some embodiments, the DNA structures 100 may be those DNA structures described in Wei et al., supra, that are composed of DNA subunits having dimensions of less than 10 nm. In some embodiments, the DNA structures 100 may comprise the DNA origami disclosed in U.S. Pat. No. 8,501,923 that has dimensions of 100-200 nm.

As shown in FIG. 1, a patterned substrate 300 comprises patterned regions 310 of different configurations, e.g., patterned regions A', B', C', D', E', F', G', H', I', L', M', and N'. The patterned substrate 300 is prepared by selectively patterning a substrate to create multiple regions 310, wherein each of the regions 310 is for a specific DNA structure. In some embodiments and as described in more detail below, the substrate is patterned to create regions that exhibit chemical specificity with the DNA structures. For example, the regions of the patterned substrate include chemical specificity for adsorbing the DNA structures, such as via Van der Waals, ionic and/or electrostatic interactions. In some embodiments, the substrate is patterned to create regions that have topological specificity with the DNA structures. For example, the regions of the patterned substrate have size and/or morphology corresponding to the size and/or morphology of the DNA structures. In some embodiments, the substrate is patterned to create regions that exhibit both chemical and topological specificity with the DNA structures. As shown in FIG. 1, the region A' of the patterned substrate 300 corresponds in size and/or morphology to the size and/or morphology of the DNA structure A, and the region B' corresponds in size and/or morphology to the size and/or morphology of DNA structure B. Any conventional techniques may be used to pattern the substrate.

Accordingly, a method of forming a nanostructure comprises forming a directed self-assembly of nucleic acid structures on a patterned substrate. The patterned substrate comprises multiple regions. Each of the regions on the patterned substrate is specifically tailored for adsorption of a specific nucleic acid structure in the directed self-assembly of nucleic acid structures.

Figure 2:
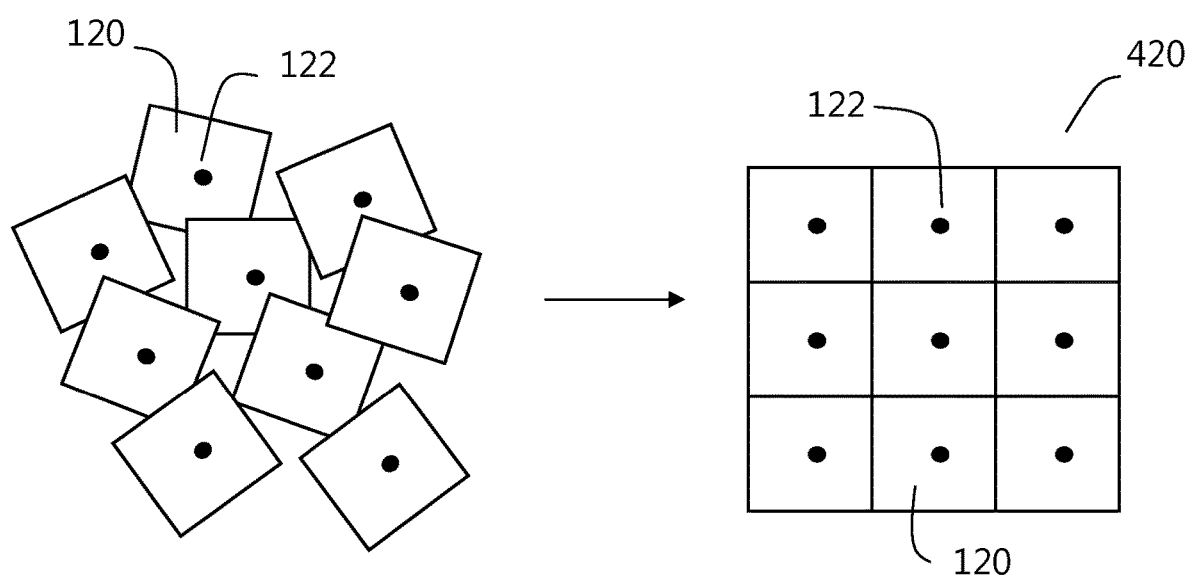
FIG. 2 shows a directed self-assembly of multiple isotropic DNA structures according to one embodiment of the present disclosure.

In FIG. 2, a directed self-assembly 420 is formed from nine DNA structures 120 on a patterned substrate (not shown). As shown in FIG. 2, each of the DNA structures 120 has the same configuration, such as the same length and width with an opening 122 in the middle of the DNA structure 120. The dimensions of the opening 122 are at a sublithographic scale. As with the embodiment described for FIG. 1, the patterned substrate may include regions that correspond in size and/or morphology to the size and/or morphology of the DNA structures 120. The DNA structure 120 is isotropic (i.e., the DNA structure has physical properties that are the same regardless of the direction of measurement). Since the DNA structures 120 are isotropic, the DSA 420 of DNA structures 120 is not susceptible to orientational or sequential placement errors. Thus, each of the nine DNA structures 120 may adsorb to any region of the patterned substrate and neither orientational control nor sequential control is required for the formation of DSA 420. Furthermore, the patterned substrate may include regions that correspond in size and/or shape of the array of the DNA structures 120.

By way of non-limiting example, in some embodiments, the nine isotropic DNA structures 120 may form a 3×3 array-DSA on the patterned substrate. Since each of the DNA structures 120 includes the opening 122, the DSA 420 of DNA structures 120 may be used to create a contact hole pattern in a semiconductor device, with the holes having sublithographic dimensions. In some other embodiments, each of the DNA structures 120 includes plurality of openings at a sublithographic pitch. The DSA 420 of DNA structures 120 enables a large array of sublithographic features or pillars at a sublithographic pitch.

Figure 3:
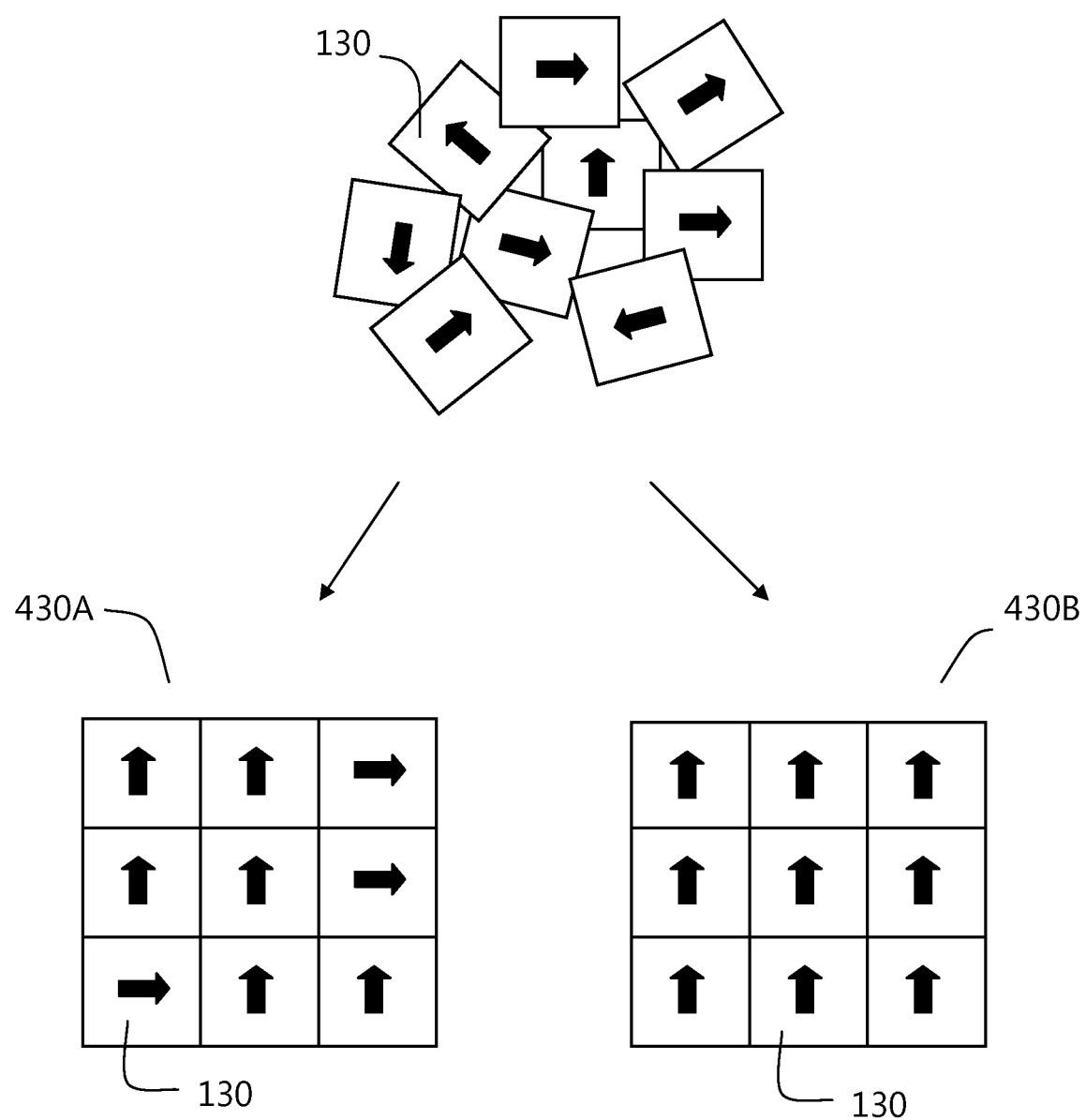
FIG. 3 shows a directed self-assembly of multiple anisotropic DNA structures according to one embodiment of the present disclosure.

In FIG. 3, a directed self-assembly is formed from nine anisotropic DNA structures 130 assembled into a 3×3 array on a patterned substrate (not shown). The arrow symbol on the DNA structures 130 indicates the required orientation of the structure containing the sublithographic pattern. As with the embodiment described for FIG. 1, the patterned substrate may include regions that correspond in size and/or morphology to the size and/or morphology of the DNA structures 130. The DNA structure 130 is anisotropic (i.e., the DNA structure has physical properties that differ based on the direction of measurement). Since the DNA structures 130 are anisotropic, the DSA of DNA structures 130 does not always provide a desired DSA unless orientational control is provided during the adsorption of the anisotropic DNA structures 130 to the patterned substrate. Without providing orientational control, the anisotropic DNA structures 130 may assemble into undesirable DSA 430A, where the arrows pointing in different directions indicate orientation errors. With orientational control, the anisotropic DNA structures 130 may assemble into the desired DSA 430B, where the arrows pointing in same directions indicate the absence of orientation errors. By way of non-limited example, the nine anisotropic DNA structures 130 may form a 3×3 array-DSA on the patterned substrate. The DSA 430B may be used to create a sublithographic logic gate or interconnect patterns in semiconductor devices where sequence is not critical.

Figure 4:
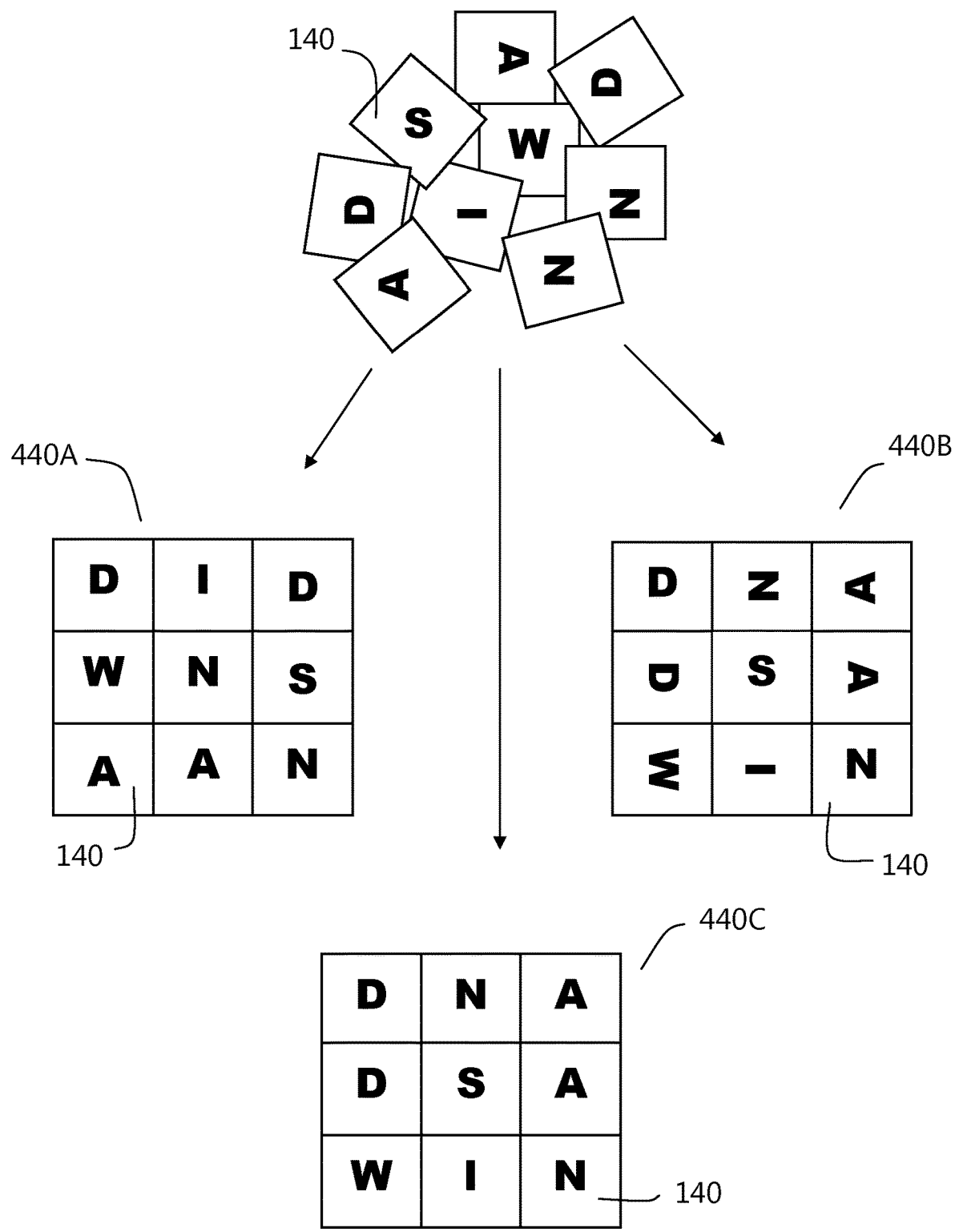
FIG. 4 shows a directed self-assembly of multiple anisotropic DNA structures according to another embodiment of the present disclosure.

In FIG. 4, a directed self-assembly is formed from nine anisotropic DNA structures 140 assembled into a 3×3 array on a patterned substrate (not shown). The letter symbols on the DNA structures 140 indicate that the sublithographic features to be transferred to the substrate require specific orientation and sequence control. The sublithographic features may include regular, periodic, patterns or irregular, i.e., sparse, patterns, corresponding to dense array features or peripheral routing, logic, interconnects, or contacts. As with the embodiment described for FIG. 1, the patterned substrate may include regions that correspond in size and/or morphology to the size and/or morphology of the DNA structures 140. Since the DNA structures 140 are anisotropic, the DSA of DNA structures 140 does not always provide a desired DSA unless orientational and sequential control is provided. If orientational control is provided but no sequential control is provided, the anisotropic DNA structures 140 may assemble into undesirable DSA 440A. As shown, although all letters in the DSA 440A are in the desired upright orientation, the DSA 440A does not provide any discernible message. If sequential control is provided but no orientational control is provided, the anisotropic DNA structures 140 may assemble into undesirable DSA 440B. As shown, all letters in the DSA 440B are in the desired sequence. However, the DSA 440B does not provide any discernible message because some letters are not in the desirable upright orientation. When both orientational control and sequential control are provided, the anisotropic DNA structures 140 may assemble into the desired DSA 440C so that the message (e.g., "DNA DSA WIN") may be read. Thus, in the embodiment as shown in FIG. 4, both orientational control and sequential control are provided during assembling of DNA structures 140 to provide the directed self-assembly 440C of multiple DNA structures with minimum orientational and sequential errors.

Accordingly, a nanostructure comprises directed self-assembly of DNA structures on a patterned substrate. The patterned substrate comprises regions, wherein each of the regions is configured to selectively adsorb a specific DNA structure in the directed self-assembly of DNA structures.

In some embodiments, the directed self-assembly of DNA structures is formed on the patterned substrate with an orientational control. In some embodiments, the directed self-assembly of DNA structures is formed on the patterned substrate with a sequential control. In some embodiments, the directed self-assembly of DNA structures is formed on the patterned substrate with both orientational and sequential controls.

Each of the regions on the patterned substrate corresponds to a DNA structure in the DSA of multiple DNA structures. The selective adsorption of the specific DNA structure to the specific region on the patterned substrate is driven thermodynamically by an energy minimization of the resulting DSA of the multiple DNA structures. As described in more detail below, a specific DNA structure may adsorb to its corresponding region on the patterned substrate by achieving its lowest energy configuration. Adsorption between a specific DNA structure and its corresponding region of the patterned substrate may be energetically favorable, while adsorption between a specific DNA structure and other regions of the patterned substrate may be energetically unfavorable.

In some embodiments and as described in more detail below, the regions of the patterned substrate include chemical specificity for adsorbing to the DNA structures, such as via Van der Waals, ionic, and/or electrostatic interactions. In some embodiments, the regions of the patterned substrate include topological specificity to the DNA structures. In some embodiments, the regions of the patterned substrate include both topological and chemical specificity to the DNA structures.

FIGS. 5a, 5b, and 6-8 show various stages in the preparation of nanostructures according to some embodiments of the present disclosure.

Figure 5A:
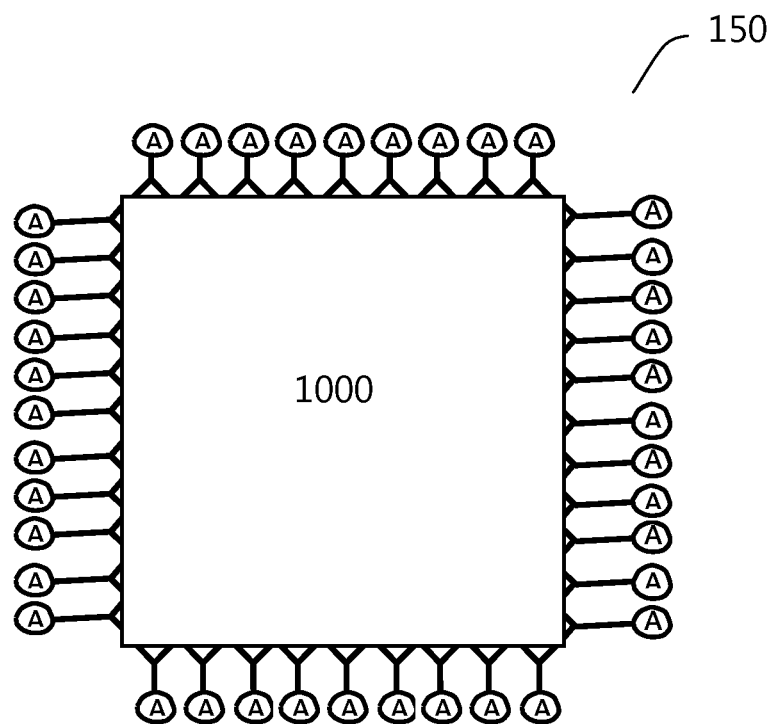
FIG. 5a is a top view of a functionalized DNA structure.
Figure 5B:
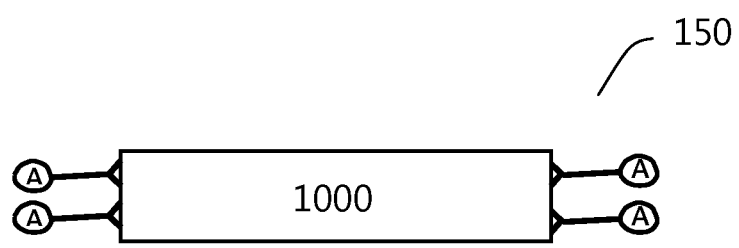
FIG. 5b is a cross-sectional view of a functionalized DNA structure.

FIGS. 5a and 5b show a top view and cross-sectional view, respectively, of a functionalized DNA structure 150. As shown, the functionalized DNA structure 150 comprises a DNA structure 1000 and multiple functional groups "A" on the DNA structure 1000. The functional groups "A" may include, but are not limited to, a phosphate linkage, a complementary RNA strand, a short DNA strand, or other reactive group. The DNA structure 1000 may include any of DNA structures 100, DNA structures 120, DNA structures 130, or DNA structures 140 as described above.

Figure 6:
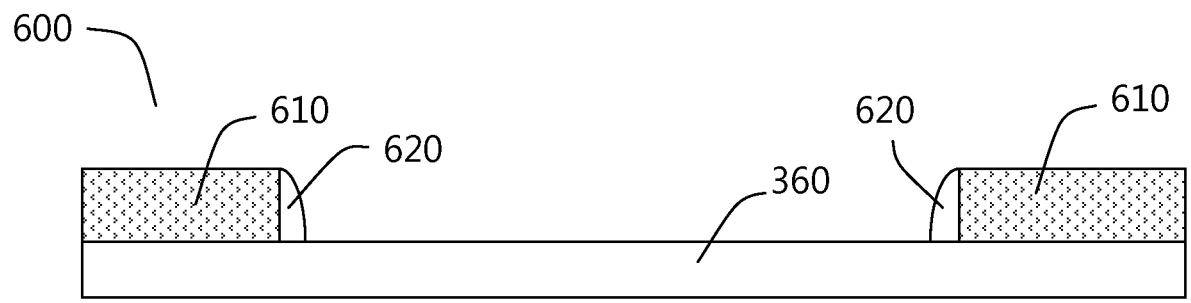
FIG. 6 shows a semiconductor structure comprising a substrate, a sacrificial pattern material, and spacers.

FIG. 6 shows a semiconductor structure 600 comprising a substrate 360, a sacrificial pattern material 610 on the substrate 360, and spacers 620. The sacrificial pattern material 610 and the spacers 620 may be formed on the substrate 360 by any conventional methods.

After removal of the sacrificial pattern material 610 from the semiconductor structure 600, the spacers 620 on the substrate 360 may be derivatized to include functional groups "B." The functional groups "B" have chemical specificity to the functional groups "A" of the functionalized DNA structure 150 shown in FIG. 5a or FIG. 5b.

Figure 7:
FIG. 7 shows a patterned substrate comprising a substrate and functionalized spacers.

As shown in FIG. 7, the patterned substrate 700 comprises the substrate 360 and functionalized spacers 670 protruding from the substrate 360. Each of the functionalized spacers 670 comprises a spacer 620 and multiple functional groups "B" on the spacer 620.

Figure 8:
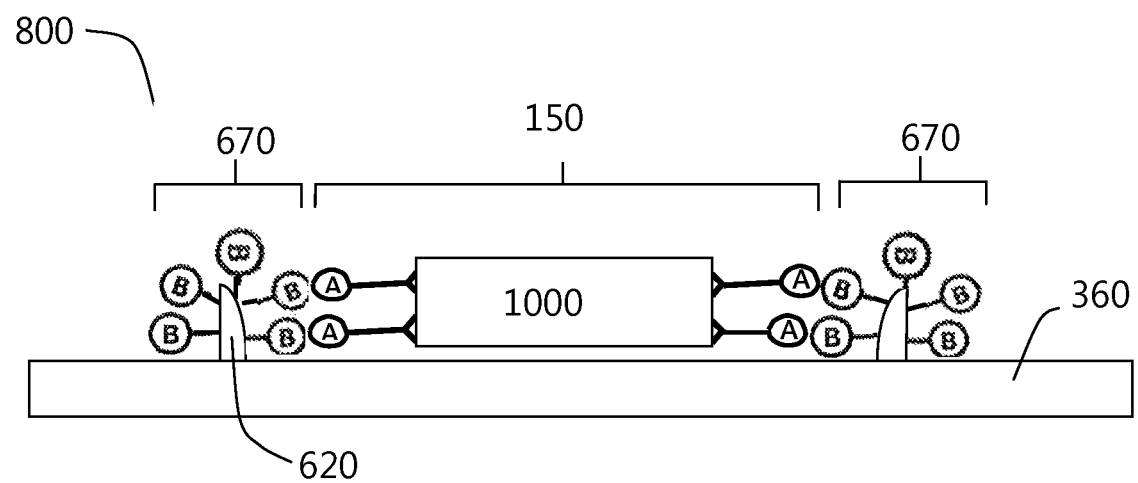
FIG. 8 shows a semiconductor structure comprising a substrate, functionalized spacers, and a functionalized DNA structure.

Upon contacting the functionalized DNA structure 150 with the patterned substrate 700, the chemical specificity between the functional groups "A" of the functionalized DNA structure 150 and the functional groups "B" on the functionalized spacers 670 of the patterned substrate 700 directs the selective absorption of the functionalized DNA structure 150 onto the specific region on the patterned substrate 700 to provide a semiconductor structure 800, as shown in FIG. 8. Favorable interactions between the "A" and "B" functional groups may enable the functionalized DNA structure 150 to selectively adsorb onto the specific region on the patterned substrate 700.

Accordingly, a method of forming a nanostructure comprises patterning a substrate to create a patterned substrate and contacting the patterned substrate with DNA structures. The patterned substrate comprises regions. The method further comprises selectively adsorbing the DNA structures to a specific region on the patterned substrate to form a self-assembly of DNA structures on the patterned substrate.

The nanostructures of present disclosure may be used for fabrication of various semiconductor structures and devices. By way of non-limiting example, the nanostructures, such as DSA 400, the DSA 420, the DSA 430B, or the DSA 440C described in FIGS. 1-4, may be used to transfer the sublithographic features of the DNA structures 100, the DNA structures 120, the DNA structures 130, or the DNA structures 140 into the substrate, such as for fabricating sublithographic feature devices, contacts, contact holes, interconnects, etc. In some embodiments, the DSA of DNA structures may be removed during further processing acts of the fabrication of semiconductor structures and devices. In some embodiments, the DSA of DNA structures may remain during further processing acts of the fabrication.

The disclosed methods of forming nanostructures use the directed self-assembly of multiple DNA structures, and may provide the nanostructures having dimensions of less than 40 nm with reduced defect levels. Furthermore, the nanostructures may have any arbitrary structures depending on the designs of the DNA structures.

It is also understood that the directed self-assembly of DNA structures are used herein to exemplify the invention. The directed self-assembly of other nucleic acid structures may be used in the present disclosure, e.g., the directed self-assembly of RNA structures, the directed self-assembly of PNA structures, etc.

While the present disclosure is susceptible to various modifications and alternative forms, specific embodiments have been shown by way of example in the drawings and have been described in detail herein. However, the present disclosure is not intended to be limited to the particular forms disclosed. Rather, the present disclosure is to cover all modifications, equivalents, and alternatives falling within the scope of the present disclosure as defined by the following appended claims and their legal equivalents.

What is claimed is:

1. A method of forming a nanostructure, the method comprising:
   forming a patterned semiconductive substrate comprising one or more regions, each of the one or more regions tailored to adsorb a specific nucleic acid structure;
   contacting the patterned semiconductive substrate with nucleic acid structures comprising the specific nucleic acid structures; and
   selectively adsorbing the specific nucleic acid structures to the respective one or more regions of the patterned semiconductive substrate to form a directed self-assembly of nucleic acid structures on the patterned semiconductive substrate.

2. The method of claim 1, wherein forming a patterned semiconductive substrate comprises patterning the semiconductive substrate to create the one or more regions formulated to exhibit chemical specificity to the specific nucleic acid structures.

3. The method of claim 1, wherein forming a patterned semiconductive substrate comprises patterning the semiconductive substrate to create the one or more regions configured to exhibit topological specificity to the specific nucleic acid structures.

4. The method of claim 1, wherein forming a patterned semiconductive substrate comprising one or more regions comprises patterning the semiconductive substrate to comprise regions corresponding in at least one of size or morphology to at least one of size or morphology of the specific nucleic acid structures.

5. The method of claim 1, wherein selectively adsorbing the specific nucleic acid structures to the respective one or more regions of the patterned semiconductive substrate comprises achieving a lowest energy configuration between adsorption of the specific nucleic acid structures to the one or more regions of the patterned semiconductive substrate.

6. The method of claim 1, wherein forming a directed self-assembly of nucleic acid structures on the patterned semiconductive substrate comprises forming the directed self-assembly comprising sublithographic openings in the nucleic acid structures.

7. The method of claim 1, wherein forming a directed self-assembly of nucleic acid structures on the patterned semiconductive substrate comprises forming the directed self-assembly comprising isotropic nucleic acid structures.

8. The method of claim 1, wherein forming a directed self-assembly of nucleic acid structures on the patterned semiconductive substrate comprises forming the directed self-assembly comprising sublithographic features at a sublithographic pitch on the patterned semiconductive substrate.

9. The method of claim 8, further comprising transferring the sublithographic features to the patterned semiconductive substrate.

10. The method of claim 1, wherein forming a directed self-assembly of nucleic acid structures on the patterned semiconductive substrate comprises forming the directed self-assembly comprising anisotropic nucleic acid structures.

11. The method of claim 10, wherein forming the directed self-assembly comprising anisotropic nucleic acid structures comprises providing orientational control and sequential control during the adsorption of the anisotropic nucleic acid structures to the patterned semiconductive substrate.

12. The method of claim 11, wherein providing orientational control and sequential control during the adsorption of the anisotropic nucleic acid structures comprises forming the directed self-assembly of nucleic acid structures with minimum orientational and sequential errors.

13. The method of claim 1, further comprising using the directed self-assembly of nucleic acid structures as a mask.

14. The method of claim 1, wherein selectively adsorbing the specific nucleic acid structures to the respective one or more regions of the patterned semiconductive substrate comprises selectively adsorbing specific deoxyribonucleic acid structures to the respective one or more regions.

15. The method of claim 1, wherein selectively adsorbing the specific nucleic acid structures to the respective one or more regions of the patterned semiconductive substrate comprises selectively adsorbing specific ribonucleic acid structures to the respective one or more regions.

16. The method of claim 1, wherein selectively adsorbing the specific nucleic acid structures to the respective one or more regions of the patterned semiconductive substrate comprises chemically interacting the specific nucleic acid structures with the respective one or more regions.

17. A method of forming a nanostructure, the method comprising:
   forming a patterned semiconductive substrate comprising at least one region tailored to adsorb a specific nucleic acid structure, the specific nucleic acid structure formulated to exhibit at least one of topological specificity or chemical specificity to the at least one region;
   contacting the patterned semiconductive substrate with nucleic acid structures comprising the specific nucleic acid structure;
   adsorbing the specific nucleic acid structure to the at least one region of the patterned semiconductive substrate to form a directed self-assembly of nucleic acid structures comprising sublithographic features on the patterned semiconductive substrate; and
   transferring the sublithographic features to the patterned semiconductive substrate.

18. The method of claim 17, further comprising removing the directed self-assembly of nucleic acid structures.

19. A nanostructure comprising:
   a directed self-assembly of nucleic acid structures on a patterned semiconductive substrate, the patterned semiconductive substrate comprising regions and a specific nucleic acid structure of the directed self-assembly of nucleic acid structures selectively adsorbed to each of the regions of the patterned semiconductive substrate, each of the regions corresponding in at least one of size or morphology to at least one of size or morphology of the specific nucleic acid structure.

20. A nanostructure comprising:
   a directed self-assembly of nucleic acid structures on a patterned semiconductive substrate, the patterned semiconductive substrate comprising regions and a specific nucleic acid structure of the directed self-assembly of nucleic acid structures selectively adsorbed to each of the regions of the patterned semiconductive substrate, each of the regions formulated to exhibit chemical specificity to the specific nucleic acid structure.

21. The method of claim 1, wherein forming a patterned semiconductive substrate comprising one or more regions comprises forming the patterned semiconductive substrate comprising regions, each of the regions tailored to adsorb the same specific nucleic acid structure.

22. The method of claim 1, wherein forming a patterned semiconductive substrate comprising one or more regions comprises forming the patterned semiconductive substrate comprising regions, each of the regions tailored to adsorb a different specific nucleic acid structure.

23. The method of claim 17, wherein adsorbing the specific nucleic acid structure to the at least one region of the patterned semiconductive substrate comprises adsorbing the specific nucleic acid structure to the at least one region by chemical specificity.

24. The method of claim 17, wherein adsorbing the specific nucleic acid structure to the at least one region of the patterned semiconductive substrate comprises adsorbing the specific nucleic acid structure to the at least one region by topological specificity.

* * * * *